US008158264B2

(12) United States Patent
David et al.

(10) Patent No.: US 8,158,264 B2
(45) Date of Patent: Apr. 17, 2012

(54) METHOD FOR EASY-TO-CLEAN SUBSTRATES AND ARTICLES THEREFROM

(75) Inventors: Moses M. David, Woodbury, MN (US); Steven J. Martin, Shoreview, MN (US); Rudolf J. Dams, Antwerp (BE); Wayne W. Fan, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 491 days.

(21) Appl. No.: 12/445,978

(22) PCT Filed: Oct. 18, 2007

(86) PCT No.: PCT/US2007/081759
§ 371 (c)(1),
(2), (4) Date: Apr. 17, 2009

(87) PCT Pub. No.: WO2008/051789
PCT Pub. Date: May 2, 2008

(65) Prior Publication Data
US 2010/0316868 A1    Dec. 16, 2010

Related U.S. Application Data

(60) Provisional application No. 60/862,303, filed on Oct. 20, 2006.

(51) Int. Cl.
*B32B 9/04* (2006.01)
(52) U.S. Cl. ............................ 428/447; 428/448; 428/450
(58) Field of Classification Search .................. 428/447, 428/448, 450
See application file for complete search history.

(56) References Cited

U.S. PATENT DOCUMENTS

| | | | |
|---|---|---|---|
| 2,803,615 A | 8/1957 | Ahlbrecht et al. |
| 3,423,234 A | 1/1969 | Heine |
| 3,442,664 A | 5/1969 | Heine |
| 3,492,394 A | 1/1970 | Heine |
| 3,646,085 A | 2/1972 | Bartlett |
| 3,810,874 A | 5/1974 | Mitsch et al. |
| 3,950,588 A | 4/1976 | McDougal |
| 4,003,760 A | 1/1977 | Labenski et al. |
| 4,085,137 A | 4/1978 | Mitsch et al. |
| 4,094,749 A | 6/1978 | Stange et al. |
| 4,601,950 A | 7/1986 | Iida et al. |
| 5,256,318 A | 10/1993 | Masutani et al. |
| 5,274,159 A | 12/1993 | Pellerite et al. |
| 5,284,711 A | 2/1994 | Ihara |
| 5,306,758 A | 4/1994 | Pellerite |
| 5,437,894 A | 8/1995 | Ogawa et al. |
| 5,476,717 A | 12/1995 | Floch |
| 5,550,277 A | 8/1996 | Paciorek et al. |
| 5,578,278 A | 11/1996 | Fall et al. |
| 5,658,962 A | 8/1997 | Moore et al. |
| 5,702,509 A | 12/1997 | Pellerite et al. |
| 5,718,967 A | 2/1998 | Hu et al. |
| 5,851,674 A | 12/1998 | Pellerite et al. |
| 5,888,594 A | 3/1999 | David et al. |
| 5,980,992 A | 11/1999 | Kistner et al. |
| 6,015,597 A | 1/2000 | David |
| 6,183,872 B1 | 2/2001 | Tanaka et al. |
| 6,184,187 B1 | 2/2001 | Howell et al. |
| 6,277,485 B1 | 8/2001 | Invie et al. |
| 6,361,870 B1 | 3/2002 | Steffl et al. |
| 6,592,659 B1 | 7/2003 | Terrazas et al. |
| 6,613,860 B1 | 9/2003 | Dams et al. |
| 6,649,272 B2 | 11/2003 | Moore et al. |
| 6,689,854 B2 | 2/2004 | Fan et al. |
| 6,696,157 B1 | 2/2004 | David et al. |
| 6,716,534 B2 | 4/2004 | Moore et al. |
| 6,878,419 B2 | 4/2005 | David et al. |
| 6,977,307 B2 | 12/2005 | Dams |
| 6,991,826 B2 | 1/2006 | Pellerite et al. |
| 7,166,329 B2 | 1/2007 | Dams |
| 7,321,018 B2 | 1/2008 | Dams et al. |
| 7,470,741 B2 | 12/2008 | Dams |
| 7,495,118 B2 | 2/2009 | Dams et al. |
| 7,652,115 B2 | 1/2010 | Dams et al. |
| 2001/0055672 A1 | 12/2001 | Todd |
| 2003/0073588 A1 | 4/2003 | Howell et al. |
| 2004/0142185 A1 | 7/2004 | Takushima |
| 2005/0048288 A1 | 3/2005 | Flynn et al. |
| 2005/0136180 A1 | 6/2005 | Pellerite et al. |
| 2005/0136264 A1 | 6/2005 | Dams et al. |
| 2005/0166791 A1 | 8/2005 | Flynn et al. |
| 2005/0271900 A1 | 12/2005 | Kobrin et al. |
| 2006/0029818 A1* | 2/2006 | Suzuki et al. .................. 428/447 |
| 2006/0131700 A1 | 6/2006 | David et al. |
| 2006/0246221 A1 | 11/2006 | Falk et al. |
| 2010/0285227 A1 | 11/2010 | Yapel et al. |

FOREIGN PATENT DOCUMENTS

| | | |
|---|---|---|
| DE | 103 10 827 | 9/2004 |
| DE | 10 2004 029 911 | 1/2005 |
| EP | 0 526 976 | 2/1993 |
| EP | 0 661 558 | 7/1995 |
| EP | 0 842 908 | 5/1998 |
| EP | 1 225 187 | 7/2002 |
| GB | 2 218 097 | 11/1989 |

(Continued)

OTHER PUBLICATIONS

Pellerite, Mark J., et al., "Effects of Fluorination on Self-Assembled Monolayer Formation from Alkanephosphonic Acids on Aluminum: Kinetics and Structure," *Journal of Physical Chemistry B*, vol. 107 (2003) pp. 11726-11736.
International Search Report, PCT/US2007/081759, dated Mar. 20, 2008.

*Primary Examiner* — Edward Cain

(57) ABSTRACT

A method of forming an easy-to-clean metal or metallized substrate, the method comprising forming a layer comprising silicon, oxygen, and hydrogen on at least a portion of a surface of the substrate by plasma deposition; and applying an at least partially fluorinated composition comprising at least one silane group to at least a portion of a surface of the layer comprising the silicon, oxygen, and hydrogen; and an easy-to-clean article made by the method are disclosed.

20 Claims, 1 Drawing Sheet

FOREIGN PATENT DOCUMENTS

| | | |
|---|---|---|
| JP | 11-048402 | 2/1999 |
| JP | 2002-030707 | 1/2002 |
| JP | 2003-064348 | 3/2003 |
| WO | 00/63312 | 10/2000 |
| WO | 00/66353 | 11/2000 |
| WO | 03/002269 | 1/2003 |
| WO | 03/056187 | 7/2003 |
| WO | 2005/085374 | 9/2005 |

* cited by examiner

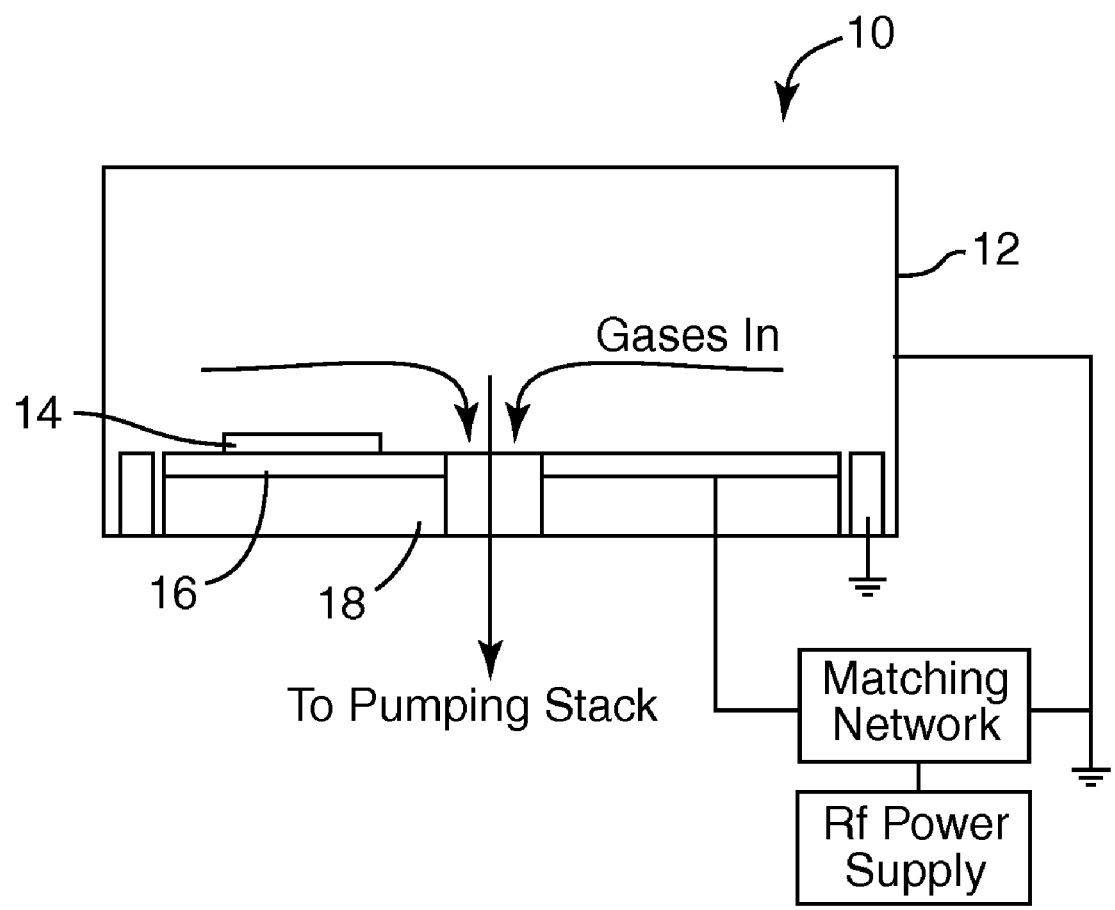

METHOD FOR EASY-TO-CLEAN SUBSTRATES AND ARTICLES THEREFROM

CROSS REFERENCE TO RELATED APPLICATIONS

This application is the National Stage filing under 35 U.S.C. 371 of International Application No. PCT/US2007/081759, filed Oct. 18, 2007, which claims priority to U.S. Provisional Application Ser. No. 60/862303, filed Oct. 20, 2006, which is incorporated herein by reference in its entirety.

BACKGROUND

In the past, various efforts have been made to impart repellent properties to a substrate. For example, silane compounds or compositions that have one or more fluorinated groups have been successfully used for rendering substrates such as glass and ceramics oil and water repellent. Such silane compounds or compositions have typically included one or more hydrolysable groups and at least one fluorinated alkyl group or fluorinated polyether group. Substrates that have been treated for oil and water repellency include glass, ceramics such as bathroom tile, enamel, metals, natural and man-made stone, polymers, and wood. Despite these advances, there continues to be a need for improved methods for imparting repellent properties to substrates, and substrates having improved repellency properties.

SUMMARY

Metal substrates and metallized substrates are found in a variety of environments, including kitchens and bathrooms, as well as out door areas, where they can come in contact with aqueous residues such as food, soap, and minerals, such as lime. Removing such deposits from, for example, faucets, shower heads, hand rails, and the like often requires aggressive scrubbing, frequently with acidic cleaners or detergents, and often challenge the esthetic appearance and durability of the surface of these substrates. Easy-to-clean metal substrates and metallized substrates which allow removal of aqueous deposits, such as mineral deposits, with a wipe without the need for aggressive scrubbing and which retain this property with repeated wipes would, therefore, be advantageous. A method that can achieve this and articles made therefrom have now been found.

In one aspect, the present invention provides a method of forming at least one of an easy-to-clean metal substrate or an easy-to-clean metallized substrate, the method comprising:

forming a layer comprising silicon, oxygen, and hydrogen on at least a portion of a surface of the substrate by plasma deposition; and applying an at least partially fluorinated composition comprising at least one silane group to at least a portion of a surface of the layer comprising the silicon, oxygen, and hydrogen.

For certain embodiments, the method of forming an easy-to-clean metal or metallized substrate provides any one or any combination the following properties to the substrate: surface contaminants can be easily removed; limestone deposits can be easily removed; appearance can be essentially unchanged; and can have oil, water, stain, and dirt repellency. For certain embodiments, at least one of a color hue or the intensity of a color hue can be changed. These properties can be retained for an extended period of time and even after repeated wipes, for example, with a dry paper wipe.

In another aspect, there is provided an easy-to-clean coated article comprising:

at least one of a metal substrate or a metallized substrate;

a plasma deposited layer disposed on the substrate, wherein the plasma deposited layer comprises at least about 10 atomic percent silicon, at least about 10 atomic percent oxygen, and at least about 5 atomic percent hydrogen; wherein all atomic percent values are based on the total atomic weight of the plasma deposited layer; and a coating bonded to the plasma deposited layer;

wherein the coating comprises an at least partially fluorinated composition comprising at least one silane group which shares at least one covalent bond with the plasma deposited layer.

In one preferred embodiment, there is provided an easy-to-clean coated article comprising:

at least one of a metal substrate or a metallized substrate;

a plasma deposited layer disposed on the substrate, wherein the plasma deposited layer comprises at least about 10 atomic percent silicon, at least about 10 atomic percent oxygen, and at least about 5 atomic percent hydrogen; wherein all atomic percent values are based on the total atomic weight of the plasma deposited layer; and a polyfluoropolyether-containing coating bonded to the plasma deposited layer; wherein the polyfluoropolyether-containing coating comprises polyfluoropolyether silane groups of the following Formula Ib:

$$R_f[Q'\text{-}C(R)_2\text{---}Si(O\text{---})_{3-x}(R^{1a})_x]_z \qquad \text{Ib}$$

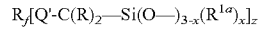

which shares at least one covalent bond with the plasma deposited layer; and wherein:

$R_f$ is a monovalent or multivalent polyfluoropolyether segment;

Q' is an organic divalent linking group;

each R is independently hydrogen or a $C_{1-4}$ alkyl group;

$R^{1a}$ is a $C_{1-8}$ alkyl or phenyl group;

x is 0 or 1 or 2; and z is 1, 2, 3, or 4.

For certain embodiments, the easy-to-clean coated article has any one or any combination the following properties: surface contaminants can be easily removed; limestone deposits can be easily removed; appearance can be essentially unchanged; can have oil, water, stain, and dirt repellency; the coating can be resistant to detergents and non-abrasive cleaners, including acidic cleaners that may be used to remove limestone deposits, and the coating can be extremely durable to mechanical abrasion. For certain embodiments, at least one of a color hue or the intensity of a color hue can be changed with respect to the substrate without the plasma deposited layer and coating. These properties can be retained for an extended period of time and even after repeated wipes, for example, with a dry paper wipe.

As used herein, the terms "alkyl" and the prefix "alk" are inclusive of both straight chain and branched chain groups and of cyclic groups, e.g., cycloalkyl. Unless otherwise specified, these groups contain from 1 to 20 carbon atoms. In some embodiments, these groups have a total of up to 10 carbon atoms, up to 8 carbon atoms, up to 6 carbon atoms, or up to 4 carbon atoms. Cyclic groups can be monocyclic or polycyclic and preferably have from 3 to 10 ring carbon atoms.

The term "alkylene" is the divalent form of the "alkyl" groups defined above.

Unless otherwise indicated, the term "halogen" refers to a halogen atom or one or more halogen atoms, including chlorine, bromine, iodine, and fluorine atoms.

The term "aryl" as used herein includes carbocyclic aromatic rings or ring systems optionally containing at least one heteroatom. Examples of aryl groups include phenyl, naphthyl, biphenyl, and pyridinyl.

The term "arylene" is the divalent form of the "aryl" groups defined above.

The term "carbamate" refers to the group —O—C(O)—N(R)— wherein R is as defined above.

The term "ureylene" refers to the group —N(R)—C(O)—N(R)— wherein R is as defined above.

The term "substituted aryl" refers to an aryl group as defined above, which is substituted by one or more substituents independently selected from the group consisting of $C_{1-4}$ alkyl, $C_{1-4}$ alkoxy, halogen, hydroxy, amino, and nitro.

As used herein, "a," "an," "the," "at least one," and "one or more" are used interchangeably.

Also herein, the recitations of numerical ranges by endpoints include all numbers subsumed within that range, including the endpoints (e.g., 1 to 5 includes 1, 1.5, 2, 2.75, 3, 3.80, 4, 5, etc.). When the number is an integer, then only the whole numbers are included (e.g., 1, 2, 3, 4, 5, etc.).

The above summary of the present invention is not intended to describe each disclosed embodiment or every implementation of the present invention. The description that follows more particularly exemplifies illustrative embodiments. In several places throughout the application, guidance is provided through lists of examples, which examples can be used individually and in various combinations. In each instance, the recited list serves only as a representative group and should not be interpreted as an exclusive list.

BRIEF DESCRIPTION OF THE DRAWING

FIG. 1 illustrates the cross-section of a cylindrical parallel plate apparatus suitable for plasma depositing the layer comprising silicon, oxygen, and hydrogen on at least a portion of the surface of the substrate.

DETAILED DESCRIPTION OF ILLUSTRATIVE EMBODIMENTS OF THE INVENTION

In one aspect, the present invention provides a method of forming at least one of an easy-to-clean metal substrate or an easy-to-clean metallized substrate, the method comprising:

forming a layer comprising silicon, oxygen, and hydrogen on at least a portion of a surface of the substrate by plasma deposition; and applying an at least partially fluorinated composition comprising at least one silane group to at least a portion of a surface of the layer comprising the silicon, oxygen, and hydrogen.

As used herein, "metal or metallized substrate" refers to a substrate comprised of a metal and/or metal alloy, which is solid at room temperature. For certain embodiments, the metal and/or metal alloy is selected from the group consisting of chromium, chromium alloys, iron, aluminum, copper, nickel, zinc, tin, stainless steel, and brass. For certain of these embodiments, the metal and/or metal alloy is chromium or stainless steel. A metal substrate comprises one or more metals and/or metal alloys at a major surface and one or more metals and/or metal alloys throughout the body of the substrate. For certain embodiments, a major surface of the metal substrate comprises chromium. A metallized substrate comprises one or more metals and or metal alloys at a major surface. The metallized substrate can further comprise a polymeric material, which includes one or both of thermoset and thermoplastic polymers, ceramic, glass, porcelain, as well as other materials capable of having a metallized surface. For certain embodiments, a major surface of the metallized substrate comprises chromium. Examples of metal or metallized substrates include, but are not limited to, kitchen and bathroom faucets, taps, handles, spouts, sinks, drains, hand rails, towel holders, curtain rods, dish washer panels, refrigerator panels, stove tops, stove, oven, and microwave panels, exhaust hoods, grills, metal wheels or rims, and the like.

Forming a layer comprising silicon, oxygen, and hydrogen on at least a portion of the surface of the substrate by plasma deposition can be carried out in a suitable reaction chamber having a capacitively-coupled system with at least one electrode powered by an RF (radio frequency) source and at least one grounded electrode, such as those described in U.S. Pat. No. 6,696,157 (David et al.) and U.S. Pat. No. 6,878,419 (David et al.). The FIG. 1 illustrates a parallel plate apparatus 10 suitable for the plasma deposition, showing a grounded chamber 12 from which air is removed by a pumping stack (not shown). The gas or gases to form the plasma are injected radially inward through the reactor wall to an exit pumping port in the center of the chamber. Substrate 14 is positioned proximate RF-powered electrode 16. Electrode 16 is insulated from chamber 12 by a polytetrafluoroethylene support 18.

The substrate to be treated may by pre-cleaned by methods known to the art to remove contaminants that may interfere with the plasma deposition. One useful pre-cleaning method is exposure to an oxygen plasma. For this pre-cleaning, pressures in the chamber are maintained between 1.3 Pa (10 mTorr) and 27 Pa (200 mTorr). Plasma is generated with RF power levels of between 500 W and 3000 W.

A solvent washing step with an organic solvent such as acetone or ethanol may also be included prior to the exposure to an oxygen plasma.

The substrate is located on the powered electrode in the chamber, and the chamber is evacuated to the extent necessary to remove air and any impurities. This may be accomplished by vacuum pumps at a pumping stack connected to the chamber. A source gas is introduced into the chamber at a desired flow rate, which depends on the size of the reactor, the surface area of the electrodes, and the surface area of the substrate. The gas is oxygen when pre-cleaning is carried out in an oxygen plasma. During plasma deposition, the gas includes an organosilicon and/or a silane compound, and the flow rates are sufficient to establish a suitable pressure at which to carry out plasma deposition, typically 0.13 Pa to 130 Pa (0.001 Torr to 1.0 Torr). For a cylindrical reactor that has an inner diameter of approximately 55 cm and a height of approximately 20 cm, the flow rates are typically from about 50 to about 500 standard cubic centimeters per minute (sccm). At the pressures and temperatures (less than about 50° C.) of the plasma deposition, the gas remains in the vapor form. An RF electric field is applied to the powered electrode, ionizing the gas and establishing a plasma. In the RF-generated plasma, energy is coupled into the plasma through electrons. The plasma acts as the charge carrier between the electrodes. The plasma can fill the entire reaction chamber and is typically visible as a colored cloud.

The plasma also forms an ion sheath proximate at least one electrode. The ion sheath typically appears as a darker area around the electrode. Within the ion sheath, ions accelerating toward the electrode bombard the species being deposited from the plasma onto the substrate. The depth of the ion sheath normally ranges from about 1 mm to about 50 mm and depends on factors such as the type and concentration of gas used, pressure in the chamber, the spacing between the electrodes, and relative size of the electrodes. For example, reduced pressures will increase the size of the ion sheath. When the electrodes are different sizes, a larger, stronger ion sheath will form around the smaller electrode. Generally, the larger the difference in electrode size, the larger the difference in the size of the ion sheaths, and increasing the voltage across the ion sheath will increase ion bombardment energy.

The substrate is exposed to the ion bombarded species being deposited from the plasma. The resulting reactive species within the plasma react on the surface of the substrate, forming a layer, the composition of which is controlled by the composition of the gas being ionized in the plasma. The species forming the layer can attach to the surface of the substrate by covalent bonds, and therefore the layer can be covalently bonded to the substrate.

For certain embodiments, forming the layer comprising the silicon, oxygen, and hydrogen comprises ionizing a gas comprising at least one of an organosilicon or a silane compound. For certain of these embodiments, the silicon of the at least one of an organosilicon or a silane compound is present in an amount of at least about 5 atomic percent of the gas mixture. Thus, if a reactive gas such as oxygen or an inert gas such as argon are mixed along with the organosilicon or silane precursor, the atomic percent of silicon in the gas mixture is calculated based on the volumetric (or molar) flow rates of the component gases in the mixture. For certain of these embodiments, the gas comprises the organosilicon. For certain of these embodiments, the organosilicon comprises at least one of trimethylsilane, triethylsilane, trimethoxysilane, triethoxysilane, tetramethylsilane, tetraethylsilane, tetramethoxysilane, tetraethoxysilane, hexamethylcyclotrisiloxane, tetramethylcyclotetrasiloxane, tetraethylcyclotetrasiloxane, octamethylcyclotetrasiloxane, hexamethyldisiloxane, and bistrimethylsilylmethane. For certain of these embodiments, the organosilicon comprises tetramethylsilane. In addition to or alternatively, for certain of these embodiments, the gas comprises the silane compound. For certain of these embodiments, the silane compound comprises one or more of $SiH_4$ (silicon tetrahydride), $Si_2H_6$ (disilane), and $SiClH_3$ (chlorosilane). For certain of these embodiments, the silane compound comprises $SiH_4$ (silicon tetrahydride).

For certain embodiments, including any one of the above embodiments, preferably the gas further comprises oxygen.

For certain embodiments, including any one of the above embodiments, the gas further comprises at least one of argon, ammonia, hydrogen, and nitrogen. Each additional gas can be added separately or in combination with each other. For certain of these embodiments, the gas further comprises at least one of ammonia, hydrogen, and nitrogen such that the total amount of the at least one of ammonia, hydrogen, and nitrogen is at least about 5 molar percent and not more than about 50 molar percent of the gas.

Plasma deposition of the layer typically occurs at a rate ranging from about 1 to about 100 nm/second. The rate will depend on conditions including pressure, power, concentration of gas, types of gases, relative size of the electrodes, and so on. In general, the deposition rate increases with increasing power, pressure, and concentration of gas, although the rate can approach an upper limit.

For certain embodiments, including any one of the above embodiments, the plasma deposition of the layer comprising the silicon, oxygen, and hydrogen is carried out for a period of time not less than about 2 seconds, not less than about 5 seconds, or not less than about 10 seconds.

For certain embodiments, including any one of the above embodiments, the plasma deposition of the layer comprising the silicon, oxygen, and hydrogen is carried out for a period of time not more than about 30 seconds, about 20 seconds, or about 15 seconds.

For certain embodiments, including any one of the above embodiments, the plasma deposition of the layer comprising the silicon, oxygen, and hydrogen is carried out for a period of time not less than about 5 seconds and not more than about 15 seconds. For certain of these embodiments, the period of time is about 10 seconds.

For certain embodiments, the plasma deposition of the layer comprising the silicon, oxygen, and hydrogen is carried out for a period of time such that at least one of the color hue or the intensity of the color hue of the substrate is changed. For certain of these embodiments, the color hue of the substrate is changed to include an increase in a blue color hue as visually observed.

For certain embodiments, including any one of the above embodiments, the substrate is exposed to an oxygen plasma prior to the plasma deposition of the layer comprising the silicon, oxygen, and hydrogen.

After the layer comprising the silicon, oxygen, and hydrogen is formed by plasma deposition, the surface of the layer may be exposed to an oxygen plasma to form silanol groups or to form additional silanol groups on the surface of the layer. For this post-treatment, pressures in the chamber are maintained between 1.3 Pa (10 mTorr) and 27 Pa (200 mTorr). The oxygen plasma is generated with RF power levels of between about 50 W and about 3000 W.

For certain embodiments, including any one of the above embodiments, after its deposition is complete, the layer comprising the silicon, oxygen, and hydrogen is exposed to an oxygen plasma.

For certain embodiments, including any one of the above embodiments, the layer comprising silicon, oxygen, and hydrogen preferably further comprises carbon. The presence of the carbon can impart an increased flexibility and toughness to the layer.

As used herein, the "at least partially fluorinated composition comprising at least one silane group" refers to at least one of polyfluoropolyether silanes, perfluoroalkyl silanes, fluorinated oligomeric silanes, or swallow-tail silanes. In one embodiment, the at least partially fluorinated composition comprising at least one silane group is a polyfluoropolyether silane. Polyfluoropolyether silanes are represented by the Formula I:

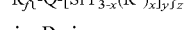

$$R_f\{-Q-[SiY_{3-x}(R^1)_x]_y\}_z \qquad I$$

wherein $R_f$ is a monovalent or multivalent polyfluoropolyether segment; Q is an organic divalent or trivalent linking group; each Y is independently a hydrolyzable group; $R^1$ is an alkyl group or a phenyl group; x is 0 or 1 or 2; y is 1 or 2, and z is 1, 2, 3, or 4.

The monovalent or multivalent polyfluoropolyether segment, $R_f$, includes linear, branched, and/or cyclic structures, that may be saturated or unsaturated, and includes two or more in-chain oxygen atoms. $R_f$ is preferably a perfluorinated group (i.e., all C—H bonds are replaced by C—F bonds). However, hydrogen or chlorine atoms may be present instead of fluorine atoms provided that not more than one atom of either hydrogen or chlorine is present for every two carbon atoms. When hydrogen and/or chlorine are present, preferably, $R_f$ includes at least one perfluoromethyl group.

The organic divalent or trivalent linking group, Q, can include linear, branched, or cyclic structures, that may be saturated or unsaturated. The organic divalent or trivalent linking group, Q, optionally contains one or more heteroatoms selected from the group consisting of sulfur, oxygen, and nitrogen, and/or optionally contains one or more functional groups selected from the group consisting of esters, amides, sulfonamides, carbonyl, carbonates, ureylenes, and carbamates. Q includes not less than 2 carbon atoms and not more than about 25 carbon atoms. Q is preferably substantially stable against hydrolysis. When more than one Q groups are present, the Q groups can be the same or different.

For certain embodiments, including any one of the above embodiments, Q includes organic linking groups such as —C(O)N(R)—(CH$_2$)$_k$—, —S(O)$_2$N(R)—(CH$_2$)$_k$—, —(CH$_2$)$_k$—, —CH$_2$O—(CH$_2$)$_k$—, —C(O)S—(CH$_2$)$_k$—, —CH$_2$OC(O)N(R)—(CH$_2$)$_k$—, and

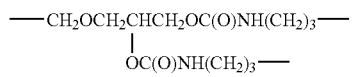

wherein R is hydrogen or C$_{1-4}$ alkyl, and k is 2 to about 25. For certain of these embodiments, k is 2 to about 15 or 2 to about 10.

The hydrolyzable groups, Y, may be the same or different and are capable of hydrolyzing, for example, in the presence of water, optionally under acidic or basic conditions, producing groups capable of undergoing a condensation reaction, for example silanol groups.

For certain embodiments, including any one of the above embodiments, the polyfluoropolyether silane is of the Formula Ia:

$$R_f[(Q'\text{-}C(R)_2\text{-}Si(Y')_{3-x}(R^{1a})_x]_z \quad \text{Ia}$$

wherein:
R$_f$ is a monovalent or multivalent polyfluoropolyether segment;
Q' is an organic divalent linking group;
each R is independently hydrogen or a C$_{1-4}$ alkyl group;
each Y' is a hydrolysable group independently selected from the group consisting of halogen, alkoxy, acyloxy, polyalkyleneoxy, and aryloxy groups;
R$^{1a}$ is a C$_{1-8}$ alkyl or phenyl group;
x is 0 or 1 or 2; and
z is 1, 2, 3, or 4.

For certain embodiments, including any one of the above embodiments of Formulas I or Ia, the monovalent or multivalent polyfluoropolyether segment, R$_f$, comprises perfluorinated repeating units selected from the group consisting of —(C$_n$F$_{2n}$)—, —(C$_n$F$_{2n}$O)—, —(CF(Z))—, (CF(Z)O)—, —(CF(Z)C$_n$F$_{2n}$O)—, —(C$_n$F$_{2n}$CF(Z)O)—, —(CF$_2$CF(Z)O)—, and combinations thereof; Z is a perfluoroalkyl group, an oxygen-containing perfluoroalkyl group, a perfluoroalkoxy group, or an oxygen-substituted perfluoroalkoxy group, each of which can be linear, branched, or cyclic, and have 1 to 9 carbon atoms and up to 4 oxygen atoms when oxygen-containing or oxygen-substituted; and n is an integer from 1 to 12. Being oligomeric or polymeric in nature, these compounds exist as mixtures and are suitable for use as such. The perfluorinated repeating units may be arranged randomly, in blocks, or in an alternating sequence. For certain of these embodiments, the polyfluoropolyether segment comprises perfluorinated repeating units selected from the group consisting of —(C$_n$F$_{2n}$O)—, —(CF(Z)O)—, —(CF(Z)C$_n$F$_{2n}$O)—, —(C$_n$F$_{2n}$CF(Z)O)—, —(CF$_2$CF(Z)O)—, and combinations thereof. For certain of these embodiments, n is an integer from 1 to 12, 1 to 6, 1 to 4, or 1 to 3.

For certain embodiments, including any one of the above embodiments, R$_f$ is monovalent, and z is 1. For certain of these embodiments, R$_f$ is terminated with a group selected from the group consisting of C$_n$F$_{2n+1}$—, C$_n$F$_{2n+1}$O—, and X'C$_n$F$_{2n}$O— wherein X' is a hydrogen or chlorine atom. For certain of these embodiments, the terminal group is C$_n$F$_{2n+1}$— or C$_n$F$_{2n+1}$O— wherein n is an integer from 1 to 6 or 1 to 3. For certain of these embodiments, the approximate average structure of R$_f$ is C$_3$F$_7$O(CF(CF$_3$)CF$_2$O)$_p$CF(CF$_3$)— or CF$_3$O(C$_2$F$_4$O)$_p$CF$_2$— wherein the average value of p is 3 to 50.

For certain embodiments, including any one of the above embodiments except where R$_f$ is monovalent, R$_f$ is divalent, and z is 2. For certain of these embodiments, R$_f$ is selected from the group consisting of —CF$_2$O(CF$_2$O)$_m$(C$_2$F$_4$O)$_p$CF$_2$—, —CF(CF$_3$)—(OCF$_2$CF(CF$_3$))$_p$O—R$_f'$—O(CF(CF$_3$)CF$_2$O)$_p$CF(CF$_3$)—, —CF$_2$O(C$_2$F$_4$O)$_p$CF$_2$—, and —(CF$_2$)$_3$O(C$_4$F$_8$O)$_p$(CF$_2$)$_3$—, and wherein R$_f'$ is a divalent, perfluoroalkylene group containing at least one carbon atom and optionally interrupted in chain by O or N, m is 1 to 50, and p is 3 to 40. For certain of these embodiments, R$_f'$ is (C$_n$F$_{2n}$), wherein n is 2 to 4. For certain of these embodiments, R$_f'$ is selected from the group consisting of —CF$_2$O(CF$_2$O)$_m$(C$_2$F$_4$O)$_p$CF$_2$—, —CF$_2$O(C$_2$F$_4$O)$_p$CF$_2$—, and —CF(CF$_3$)—(OCF$_2$CF(CF$_3$))$_p$O—(C$_n$F$_{2n}$)—O(CF(CF$_3$)CF$_2$O)$_p$CF(CF$_3$)—, and wherein n is 2 to 4, and the average value of m+p or p+p or p is from about 4 to about 24.

The above described polyfluoropolyether silanes typically include a distribution of oligomers and/or polymers, so p and m may be non-integral. The above structures are approximate average structures where the approximate average is over this distribution. These distributions may also contain perfluoropolyethers with no silane groups or more than two silane groups. Typically, distributions containing less than about 10% by weight of compounds without silane groups can be used.

For certain embodiments, including any one of the above embodiments where the organic divalent linking group, Q' is present, Q' is a saturated or unsaturated hydrocarbon group including 1 to about 15 carbon atoms and optionally containing 1 to 4 heteroatoms and/or 1 to 4 functional groups. For certain of these embodiments, Q' is a linear hydrocarbon containing 1 to about 10 carbon atoms, optionally containing 1 to 4 heteroatoms and/or 1 to 4 functional groups. For certain of these embodiments, Q'contains one functional group. For certain of these embodiments, Q' is preferably —C(O)N(R)(CH$_2$)$_2$—, —OC(O)N(R)(CH$_2$)$_2$—, —CH$_2$O(CH$_2$)$_2$—, or —CH$_2$—OC(O)N(R)—(CH$_2$)$_2$—, wherein R is hydrogen or C$_{1-4}$ alkyl.

For certain embodiments, including any one of the above embodiments where R is present, R is hydrogen.

For certain embodiments, including any one of the above embodiments where the hydrolyzable group Y or Y' is present, each Y or Y' is independently a group such as halogen, alkoxy, acyloxy, aryloxy, and polyalkyleneoxy. Alkoxy is —OR', and acyloxy is —OC(O)R', wherein each R' is independently a lower alkyl group, optionally substituted by one or more halogen atoms. For certain embodiments, R' is preferably C$_{1-6}$ alkyl and more preferably C$_{1-4}$ alkyl. Aryloxy is —OR" wherein R" is aryl optionally substituted by one or more substituents independently selected from halogen atoms and C$_{1-4}$ alkyl optionally substituted by one or more halogen atoms. For certain embodiments, R" is preferably unsubstituted or substituted C$_{6-12}$ aryl and more preferably unsubstituted or substituted C$_{6-10}$ aryl. Polyalkyleneoxy is —O—(CHR$^4$—CH$_2$O)$_q$—R$^3$ wherein R$^3$ is C$_{1-4}$ alkyl, R$^4$ is hydrogen or methyl, with at least 70% of R$^4$ being hydrogen, and q is 1 to 40, preferably 2 to 10.

For certain embodiments, including any one of the above embodiments, x is 0.

For certain embodiments, the number average molecular weight of the polyfluoropolyether silane is about 750 to about 6000, preferably about 800 to about 4000.

For certain embodiments, including any one of the above embodiments, particularly of Formula Ia, $R_f$ is —$CF_2O(CF_2O)_m(C_2F_4O)_pCF_2$—, and Q'—$C(R)_2$—$Si(Y')_{3-x}(R^{1a})_x$ is $C(O)NH(CH_2)_3Si(OR')_3$ wherein R' is methyl or ethyl. For certain of these embodiments, m and p are each about 9 to 12.

The compounds of Formulas I and Ia described above can be synthesized using standard techniques. For example, commerically available or readily synthesized perfluoropolyether esters (or functional derivatives thereof) can be combined with a functionalized alkoxysilane, such as a 3-aminopropylalkoxysilane, according to U.S. Pat. No. 3,810,874 (Mitsch et al.). It will be understood that functional groups other than esters may be used with equal facility to incorporate silane groups into a perfluoropolyether.

Perfluoropolyether diesters, for example, may be prepared through direct fluorination of a hydrocarbon polyether diester. Direct fluorination involves contacting the hydrocarbon polyether diester with $F_2$ in a diluted form. The hydrogen atoms of the hydrocarbon polyether diester will be replaced with fluorine atoms, thereby generally resulting in the corresponding perfluoropolyether diester. Direct fluorination methods are disclosed in, for example, U.S. Pat. Nos. 5,578,278 (Fall et al.) and 5,658,962 (Moore et al.).

In another embodiment, the at least partially fluorinated composition comprising one or more a silane groups is a perfluoroalkyl silane of the following Formula II:

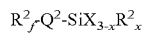

$$R^2_f\text{-}Q^2\text{-}SiX_{3-x}R^2_x \qquad\qquad II$$

wherein: $R^2_f$ is a perfluorinated group optionally containing one or more heteroatoms (for example, oxygen atoms); the connecting group $Q^2$ is a divalent alkylene group, arylene group, or mixture thereof, containing one or more heteroatoms (e.g., oxygen, nitrogen, or sulfur), or functional groups (e.g., carbonyl, amido, or sulfonamido), and containing about 2 to about 16 carbon atoms (preferably, about 3 to about 10 carbon atoms); $R^2$ is a lower alkyl group (e.g., a $C_{1-4}$ alkyl group, preferably, a methyl group); X is a halogen (for example, a chlorine atom), a lower alkoxy group (e.g., a $C_{1-4}$ alkoxy group, preferably, a methoxy or ethoxy group), or an acyloxy group (e.g., $OC(O)R^3$, wherein $R^3$ is a $C_{1-4}$ alkyl group); and x is 0 or 1. For certain embodiments, preferably x is 0. For certain of these embodiments, each X group is a lower alkoxy group. For certain of these embodiments, X is methoxy or ethoxy. Alternatively, the X groups include at least one acyloxy or halide group. For certain of these embodiments, each X is a halide, and for certain of these embodiments, each X is chloride.

For certain embodiments of Formula II, the perfluorinated group, $R^2_f$, can include linear, branched, or cyclic structures, that may be saturated or unsaturated. For certain of these embodiments, $R^2_f$ is a perfluoroalkyl group ($C_nF_{2n+1}$), wherein n is about 3 to about 20, more preferably, about 3 to about 12, and most preferably, about 3 to about 8. The divalent $Q^2$ group can include linear, branched, or cyclic structures, that may be saturated or unsaturated. For certain of these embodiments, the divalent $Q^2$ group is a linear group containing heteroatoms or functional groups, for example, as described above.

Typically, suitable fluorinated silanes include a mixture of isomers (e.g., a mixture of compounds containing linear and branched perfluoroalkyl groups). Mixtures of perfluoroalkyl silanes exhibiting different values of n can also be used.

For certain embodiments, the perfluoroalkyl silane includes any one or any combination of the following:

$C_3F_7CH_2OCH_2CH_2CH_2Si(OCH_3)_3$;
$C_7F_{15}CH_2OCH_2CH_2CH_2Si(OCH_3)_3$;
$C_7F_{15}CH_2OCH_2CH_2CH_2Si(OCH_2CH_3)_3$;
$C_7F_{15}CH_2OCH_2CH_2CH_2Si(CH_3)(OCH_3)_2$;
$C_7F_{15}CH_2OCH_2CH_2CH_2SiCl_3$; $C_7F_{15}CH_2OCH_2CH_2CH_2Si(CH_3)Cl_2$; $C_7F_{15}CH_2OCH_2CH_2CH_2SiCl(OCH_3)_2$;
$C_7F_{15}CH_2OCH_2CH_2CH_2SiCl_2(OC_2H_5)$; $C_7F_{15}C(O)NHCH_2CH_2CH_2Si(OCH_3)_3$; $CF_3(CF_2CF(CF_3))_3CF_2C(O)NHCH_2CH_2CH_2Si(OCH_3)_3$; $C_8F_{17}SO_2N(CH_3CH_3)CH_2CH_2CH_2Si(OCH_3)_3$; $C_8F_{17}SO_2N(CH_2CH_3)CH_2CH_2CH_2Si(OCH_2CH_3)_3$; $C_4F_9SO_2N(CH_3)CH_2CH_2CH_2Si(OCH_3)_3$; $C_8F_{17}CH_2CH_2Si(OCH_3)_3$; $C_6F_{13}CH_2CH_2Si(OCH_2CH_3)_3$; $C_8F_{17}CH_2CH_2Si(OCH_2CH_3)_3$; $C_8F_{17}SO_2N(CH_2CH_3)CH_2CH_2CH_2SiCl_3$; $C_8F_{17}SO_2N(CH_3)CH_2CH_2CH_2Si(CH_3)Cl_2$; and $C_8F_{17}CH_2OCH_2CH_2CH_2Si(OAc)_3$.

Methods of making perfluoroalkyl silanes of the Formula II are known. See, for example, U.S. Pat. No. 5,274,159 (Pellerite et al.).

In another embodiment, the at least partially fluorinated composition comprising at least one silane group is a fluorinated oligomeric silane of the Formula III:

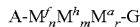

$$\text{A-M}^f_n\text{M}^h_m\text{M}^a_r\text{-G} \qquad\qquad III$$

wherein A represents hydrogen or the residue of an initiating species (i.e., an organic compound having a radical and that derives from the decomposition of a free radical initiator or that derives from a chain transfer agent);

$M^f$ represents units derived from one or more fluorinated monomers;

$M^h$ represents units derived from one or more non-fluorinated monomers;

$M^a$ represents units having a silyl group represented by the formula $SiY''_3$ wherein each Y" independently represents an alkyl group, an aryl group, or a hydrolyzable group as defined above; and G is a monovalent organic group comprising the residue of a chain transfer agent, and having the formula:

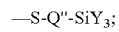

—S-Q"-$SiY_3$;

wherein Q" is an organic divalent linking group as defined below, and each Y is independently a hydrolyzable group according to any one of the above definitions of Y.

The total number of units represented by the sum of n, m, and r is generally at least 2 and preferably at least 3 so as to render the compound oligomeric. The value of n in the fluorinated oligomeric silane is between 1 and 100 and preferably between 1 and 20. The values of m and r are between 0 and 100 and preferably between 0 and 20. According to a preferred embodiment, the value of m is less than that of n and n+m+r is at least 2.

The fluorinated oligomeric silanes typically have an number average molecular weight between 400 and 100000, preferably between 600 and 20000, more preferably between 1000 and 10000. The fluorinated oligomeric silanes preferably contains at least 5 mole % (based on total moles of units $M^f$, $M^h$, and $M^a$) of hydrolysable groups. When the units $M^h$ and/or $M^a$ are present the units $M^f$, $M^h$, and/or $M^a$ may be randomly distributed.

It will further be appreciated by one skilled in the art that the preparation of fluorinated oligomeric silanes useful in the present invention results in a mixture of compounds and accordingly, general Formula III should be understood as representing a mixture of compounds whereby the indices n, m and r in Formula III represent the molar amounts of the corresponding unit in such mixture. Accordingly, it will be clear that n, m and r can be fractional values.

The units $M^f_n$ of the fluorinated oligomeric silane are derived from fluorinated monomers, preferably fluorochemical acrylates and methacrylates.

Examples of fluorinated monomers for the preparation of the fluorinated oligomeric silane include those that can be represented by general formula:

$$R^3_f\text{-}Q''\text{-}E$$

wherein $R^3_f$ represents a partially or fully fluorinated aliphatic group having at least 3 carbon atoms or a fluorinated polyether group, Q" is a bond or an organic divalent linking group, and E represents an ethylenically unsaturated group. The ethylenically unsaturated group E can be fluorinated or non-fluorinated.

The partially or fully fluorinated aliphatic group, $R^3_f$, in the fluorochemical monomer can be a fluorinated, preferably saturated, non-polar, monovalent aliphatic radical. It can be straight chain, branched chain, or cyclic or combinations thereof. It can contain heteroatoms such as oxygen, divalent or hexavalent sulfur, or nitrogen. $R^3_f$ is preferably a fully-fluorinated radical, but hydrogen or chlorine atoms may be present if not more than one atom of either is present for every two carbon atoms. The $R^3_f$ group has at least 2 and up to 18 carbon atoms, preferably 3 to 14, more preferably 4 to 10, especially 4. The terminal portion of the $R^3_f$ group is a perfluorinated moiety, which will preferably contain at least 7 fluorine atoms, e.g., $CF_3CF_2CF_2$— and $(CF_3)_2CF$—. The preferred $R^3_f$ groups are fully or substantially fluorinated and are preferably those perfluoroalkyl groups of the formula $C_nF_{2n+1}$— where n is 3 to 18, particularly 4 to 10. Compounds wherein the $R^3_f$ group is a $C_4F_9$— are generally more environmentally friendly than compounds where the $R^3_f$ group consists of a perfluorinated group with more carbon atoms.

The $R^3_f$ group can also be a perfluoropolyether group, which can be include linear, branched, and/or cyclic structures, that may be saturated or unsaturated, and substituted with one or more oxygen atoms. For certain embodiments, $R^3_f$ includes perfluorinated repeating units selected from the group consisting of —$(C_nF_{2n})$—, —$(C_nF_{2n}O)$—, —$(CF(Z))$—, —$(CF(Z)O)$—, —$(CF(Z)C_nF_{2n}O)$—, —$(C_nF_{2n}CF(Z)O)$—, —$(CF_2CF(Z)O)$—, and combinations thereof. For certain of these embodiments, Z is a perfluoroalkyl group, an oxygen-containing perfluoroalkyl group, a perfluoroalkoxy group, or an oxygen-substituted perfluoroalkoxy group, each of which can be linear, branched, or cyclic, and have 1 to 9 carbon atoms and up to 4 oxygen atoms when oxygen-containing or oxygen-substituted. For certain of these embodiments, $R^3_f$ is terminated with a group selected from the group consisting of $C_nF_{2n+1}$—, $C_nF_{2n+1}O$—, and $X'C_nF_{2n}O$—, wherein X' is a hydrogen or chlorine atom. For certain of these embodiments, the terminal group is $C_nF_{2n+1}$— or $C_nF_{2n+1}O$—. In these repeating units or terminal groups, n is an integer of 1 or more. For certain embodiments, n is an integer from 1 to 12, 1 to 6, or preferably 1 to 4. For certain of these embodiments, the approximate average structure of $R^3_f$ is $C_3F_7O(CF(CF_3)CF_2O)_pCF(CF_3)$— or $CF_3O(C_2F_4O)_pCF_2$—, wherein the average value of p is 1 to about 50. As synthesized, these materials typically include a mixture of polymers. The approximate average structure is the approximate average of the mixture of polymers.

The linking group Q" links the fluoroaliphatic or the fluorinated polyether group $R^3_f$ to the free radical polymerizable group E, and is a generally non-fluorinated organic linking groups. The linking group can be a chemical bond, but preferably contains from 1 to about 20 carbon atoms and may optionally contain oxygen, nitrogen, or sulfur-containing groups or a combination thereof. The linking group is preferably free of functional groups that substantially interfere with free-radical oligomerization (e.g., polymerizable olefinic double bonds, thiols, and other such functionality known to those skilled in the art). Examples of suitable organic divalent linking groups, Q", include, for example, —C(O)$Q^a$-$R^5$-$Q^b$-C(O)—, —C(O)O—$CH_2$—CH(OH)—$R^5$-$Q^a$-C(O)—, -$L^1$-$Q^a$-C(O)NH-$L^2$-, —$R^5$-$Q^a$-C(O)—, —C(O)$Q^a$-$R^5$—, —$R^5$—, —C(O)$Q^a$-$R^5$-$Q^a$-, —S(O)$_2$NR—$R^5$-$Q^a$-, —S(O)$_2$NR—$R^5$—, and —S(O)$_2$NR—$R^5$-$Q^a$-C(O)—, wherein $Q^a$ and $Q^b$ independently represent O or NR, R is hydrogen or $C_{1-4}$ alkyl, $R^5$ represents a linear, cyclic or branched alkylene group that may be interrupted by one or more heteroatoms such as O or N, $L^1$ and $L^2$ each independently represent a non-fluorinated organic divalent linking group including an alkylene group, a carbonyl group, a carboxy amido alkylene group and/or a carboxy alkylene group. Preferred linking groups, Q", include —S(O)$_2$N(R)—(CH$_2$)$_d$—OC(O)— and —(CH$_2$)$_d$—OC(O)—, where d is an integer from 1 to 20, preferably from 1 to 4.

Fluorochemical monomers $R^3_f$-Q"-E as described above and methods for the preparation thereof are known and disclosed, e.g., in U.S. Pat. No. 2,803,615 (Ahlbrecht et al.). Examples of such compounds include general classes of fluorochemical acrylates, methacrylates, vinyl ethers, and allyl compounds containing fluorinated sulfonamido groups, acrylates or methacrylates derived from fluorochemical telomer alcohols, acrylates or methacrylates derived from fluorochemical carboxylic acids, and perfluoroalkyl acrylates or methacrylates as disclosed in European Patent No. 0 526 976, published Jan. 15, 1997.

Perfluoropolyether acrylates or methacrylates are described in U.S. Pat. No. 4,085,137 (Mitsch et al.).

Preferred examples of fluorinated monomers include:
$CF_3(CF_2)_2CH_2OC(O)CH=CH_2$, $CF_3(CF_2)_2CH_2OC(O)C(CH_3)=CH_2$,
$CF_3(CF_2)_3CH_2OC(O)C(CH_3)=CH_2$, $CF_3(CF_2)_3Ch_2OC(O)CH=CH_2$,
$CF_3(CF_2)_3S(O)_2N(R^a)$—$(CH_2)_2$—$OC(O)CH=CH_2$,
$CF_3(CF_2)_3S(O)_2N(R^a)$—$(CH_2)_2$—$OC(O)C(CH_3)=CH_2$,
$CF_3(CF_2)_3S(O)_2N(CH_3)$—$(CH_2)_2$—$OC(O)C(CH_3)=CH_2$,
$CF_3(CF_2)_3S(O)_2N(CH_3)$—$(CH_2)_2$—$OC(O)CH=CH_2$,
$CF_3CF_2(CF_2CF_2)_{2-8}(CH_2)_2OC(O)CH=CH_2$,
$CF_3(CF_2)_7(CH_2)_2OC(O)CH=CH_2$, $CF_3(CF_2)_7(CH_2)_2OC(O)C(CH_3)=CH_2$,
$CF_3(CF_2)_7S(O)_2N(R^a)$—$(CH_2)_2$—$OC(O)CH=CH_2$,
$CF_3(CF_2)_7S(O)_2N(R^a)$—$(CH_2)_2$—$OC(O)C(CH_3)=CH_2$,
$CF_3(CF_2)_7CH_2CH_2S(O)_2N(CH_3)$—$(CH_2)_2$—$OC(O)C(CH_3)=CH_2$,
$CF_3O(CF_2CF_2)_uCH_2OC(O)CH=CH_2$, $CF_3O(CF_2CF_2)_uCH_2OC(O)C(CH_3)=CH_2$,
$C_3F_7O(CF(CF_3)CF_2O)_uCF(CF_3)CH_2OC(O)CH=CH_2$, and
$C_3F_7O(CF(CF_3)CF_2O)_uCF(CF_3)CH_2OC(O)C(CH_3)=CH_2$;
wherein $R^a$ represents methyl, ethyl or n-butyl, and u is about 1 to 50.

The units $M^h$ (when present) of the fluorinated oligomeric silane are generally derived from a non-fluorinated monomer, preferably a monomer consisting of a polymerizable group and a hydrocarbon moiety. Hydrocarbon group containing monomers are well known and generally commercially available. Examples of hydrocarbon containing monomers include those according to formula:

$$R^h\text{-}Q'''\text{-}E$$

wherein $R^h$ is a hydrocarbon group, optionally containing one or more oxyalkylene groups or one or more reactive groups, such as hydroxy groups, amino groups, epoxy groups, and halogen atoms such as chlorine and bromine, Q''' is a chemical bond or a divalent linking group as defined above for Q'', and E is an ethylenically unsaturated group as defined above. The hydrocarbon group is preferably selected from the group consisting of a linear, branched or cyclic alkyl group, an arylalkylene group, an alkylarylene group, and an aryl group. Preferred hydrocarbon groups contain from 4 to 30 carbon atoms.

Examples of non-fluorinated monomers from which the units $M^h$ can be derived include general classes of ethylenic compounds capable of free-radical polymerization, such as allyl esters such as allyl acetate and allyl heptanoate; alkyl vinyl ethers or alkyl allyl ethers, such as cetyl vinyl ether, dodecyl vinyl ether, 2-chloroethyl vinyl ether, ethyl vinyl ether; anhydrides and esters of unsaturated acids such as acrylic acid, methacrylic acid, alpha-chloro acrylic acid, crotonic acid, maleic acid, fumaric acid, and itaconic acid; vinyl, allyl, methyl, butyl, isobutyl, hexyl, heptyl, 2-ethylhexyl, cyclohexyl, lauryl, stearyl, isobornyl or alkoxyethyl acrylates and methacrylates; alpha-beta unsaturated nitriles such as acrylonitrile, methacrylonitrile, 2-chloroacrylonitrile, 2-cyanoethyl acrylate, alkyl cyanoacrylates; allyl glycolate, acrylamide, methacrylamide, n-diisopropyl acrylamide, diacetoneacrylamide, N,N-diethylaminoethylmethacrylate, N-t-butylamino ethyl methacrylate; styrene and its derivatives such as vinyltoluene, alpha-methylstyrene, alpha-cyanomethyl styrene; lower olefinic hydrocarbons which can contain halogen such as ethylene, propylene, isobutene, 3-chloro-1-isobutene, butadiene, isoprene, chloro and dichlorobutadiene, 2,5-dimethyl-1,5-hexadiene, and allyl or vinyl halides such as vinyl and vinylidene chloride. Preferred non-fluorinated monomers include hydrocarbon group containing monomers such as those selected from octadecyl methacrylate, lauryl methacrylate, butyl acrylate, N-methylol-acrylamide, isobutyl methacrylate, ethylhexyl acrylate and ethylhexyl methacrylate; and vinylchloride and vinylidene chloride.

The fluorinated oligomeric silane useful in the invention generally further includes units $M^a$ that have a silyl group with hydrolyzable groups at the terminus of the units derived from one or more non-fluorinated monomers as defined above. Examples of units $M^a$ include those that correspond to the general formula:

$$E-Z-SiY''_3$$

wherein E is an ethylenically unsaturated group as defined above, Y'' is as defined above, and Z is a chemical bond or a divalent linking group containing 1 to 20 carbon atoms and optionally containing oxygen, nitrogen, or sulfur-containing groups or a combination thereof. Z is preferably free of functional groups that substantially interfere with free-radical oligomerization (e.g., polymerizable olefinic double bonds, thiols, and other such functional groups known to those skilled in the art). Examples of suitable linking groups Z include straight chain, branched chain, or cyclic alkylene, arylene, arylalkylene, oxyalkylene, carbonyloxyalkylene, oxycarboxyalkylene, carboxyamidoalkylene, oxycarbonylaminoalkylene, ureylenealkylene, and combinations thereof. For certain embodiments, Z is selected from the group consisting of alkylene, oxyalkylene, carbonyloxyalkylene, and the formula:

$$-Q^3-T-C(O)NH-Q^4-$$

wherein $Q^3$ and $Q^4$ are independently an organic divalent linking group selected from the group consisting of alkylene, arylene, oxyalkylene, carbonyloxyalkylene, oxycarboxyalkylene, carboxyamidoalkylene, oxycarbonylaminoalkylene, and ureylenealkylene; T is O or $NR^6$ wherein $R^6$ is hydrogen, $C_{1-4}$ alkyl, or aryl. For certain of these embodiments, $Q^4$ is alkylene or arylene. Typical examples of such monomers include vinyltrichlorosilane, vinyltrimethoxysilane, vinyltriethoxysilane, and alkoxysilane functionalized acrylates or methacrylates, such as trimethoxysilylpropyl methacrylate and the like.

The fluorinated oligomeric silane is conveniently prepared through a free radical polymerization of a fluorinated monomer with optionally a non-fluorinated monomer and/or a monomer containing the silyl group in the presence of a chain transfer agent. A free radical initiator is generally used to initiate the polymerization or oligomerization reaction. Commonly known free-radical initiators can be used and examples thereof include azo compounds, such as azobisisobutyronitrile (AIBN), azo-2-cyanovaleric acid and the like, hydroperoxides such as cumene, t-butyl and t-amyl hydroperoxide, dialkyl peroxides such as di-t-butyl and dicumylperoxide, peroxyesters such as t-butylperbenzoate and di-t-butylperoxy phthalate, diacylperoxides such as benzoyl peroxide and lauroyl peroxide.

The oligomerization reaction can be carried out in any solvent suitable for organic free-radical reactions. The reactants can be present in the solvent at any suitable concentration (e.g., from about 5 percent to about 90 percent by weight based on the total weight of the reaction mixture). Examples of suitable solvents include aliphatic and alicyclic hydrocarbons (e.g., hexane, heptane, cyclohexane), aromatic solvents (e.g., benzene, toluene, xylene), ethers (e.g., diethylether, glyme, diglyme, diisopropyl ether), esters (e.g., ethyl acetate, butyl acetate), alcohols (e.g., ethanol, isopropyl alcohol), ketones (e.g., acetone, methylethyl ketone, methyl isobutyl ketone), sulfoxides (e.g., dimethyl sulfoxide), amides (e.g., N,N-dimethylformamide, N,N-dimethylacetamide), halogenated solvents such as methylchloroform, 1,1,2-trichloro-1,2,2-trifluoroethane, trichloroethylene, α,α,α-trifluorotoluene, and the like, and mixtures thereof.

The oligomerization reaction can be carried out at any temperature suitable for conducting an organic free-radical reaction. Particular temperature and solvents for use can be easily selected by those skilled in the art based on considerations such as the solubility of reagents, the temperature required for the use of a particular initiator, molecular weight desired and the like. While it is not practical to enumerate a particular temperature suitable for all initiators and all solvents, generally suitable temperatures are between about 30° C. and about 200° C., preferably between 50° C. and 100° C.

The fluorinated oligomeric silane is typically prepared in the presence of a chain transfer agent. Suitable chain transfer agents may include a hydroxy-, amino-, mercapto or halogen group. The chain transfer agent may include two or more of such hydroxy, amino-, mercapto or halogen groups. Typical chain transfer agents useful in the preparation of the fluorinated oligomeric silane include those selected from 2-mercaptoethanol, 3-mercapto-2-butanol, 3-mercapto-2-propanol, 3-mercapto-1-propanol, 3-mercapto-1,2-propanediol, 2-mercaptoethylamine, di(2-mercaptoethyl)sulfide, octylmercaptane, and dodecylmercaptane.

In a preferred embodiment, a chain transfer agent containing a silyl group having hydrolyzable groups is used in the oligomerization to produce the fluorinated oligomeric silane. Such chain transfer agents are of the following formula:

$$HS-Q^5-SiY_3$$

wherein $Q^5$ represents an organic divalent linking group such as for example a straight chain, branched chain or cyclic alkylene, arylene or arylalkylene; and each Y is independently a hydrolyzable group as defined above. $Q^5$ is preferably $C_{1-20}$ alkylene.

Alternatively, a functionalized chain transfer agent or functionalized co-monomer can be used in the oligomerization. The functional group introduced by the functionalized chain transfer agent or functionalized co-monomer can then be reacted with a silyl group containing reagent subsequent to the oligomerization to introduce a silyl group having hydrolyzable groups.

A single chain transfer agent or a mixture of different chain transfer agents may be used. For certain embodiments, 2-mercaptoethanol, octylmercaptane, and 3-mercaptopropyltrimethoxysilane are preferred chain transfer agents. A chain transfer agent is typically present in an amount sufficient to control the number of polymerized monomer units in the oligomer and to obtain the desired molecular weight of the oligomeric fluorochemical silane.

The fluorinated oligomeric silane can be prepared by oligomerizing a fluorinated monomer and optional non-fluorinated monomer with a monomer E-Z—SiY"$_3$, wherein at least one Y" represents a hydrolysable group, in the presence of a chain transfer agent which may optionally also contain a silyl group such as, for example, HS-$Q^5$-Si$Y_3$.

As a variation to the above method the oligomerization may be carried out without the use of the silyl group containing monomer but with a chain transfer agent containing the silyl group.

In another embodiment, the at least partially fluorinated composition comprising at least one silane group is a swallow-tail silane of the Formula IV:

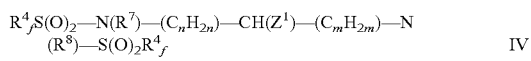

$$R^4{}_fS(O)_2\text{—}N(R^7)\text{—}(C_nH_{2n})\text{—}CH(Z^1)\text{—}(C_mH_{2m})\text{—}N(R^8)\text{—}S(O)_2R^4{}_f \qquad \text{IV}$$

wherein each $R^4{}_f$ is independently $C_pF_{2p+1}$, wherein p is 1 to 8; $R^7$ is $C_{1-4}$ alkyl or aryl; m and n are both integers from 1 to 20; $Z^1$ is hydrogen or a group of the formula —$(C_{m'}H_{2m'})$—$X^1$-$Q^5$-Si(Y)$_3$ wherein m' is 0 to 4, $X^1$ is O, S, or NH, $Q^5$ is —C(O)NH—$(CH_2)_{n'}$— or —$(CH_2)_{n'}$—, n' is an integer of 1 to 20, and Y is a hydrolysable group; and $R^8$ is $R^7$ or a group of the formula —$(CH_2)_{n'}$—Si(Y)$_3$, with the proviso that when $Z^1$ is hydrogen, then $R^8$ is a group of the formula —$(CH_2)_{n'}$—Si(Y)$_3$.

Each $R^4{}_f$ may be the same or different, and each contains 1-8 carbon atoms, preferably 2-5 carbon atoms, more preferably 4 carbon atoms.

For certain embodiments, including any one of the above embodiments of Formula IV, m is an integer from 1 to 6, and n is an integer from 1 to 6.

For certain embodiments, including any one of the above embodiments of Formula IV, $R^7$ is $C_{1-4}$ alkyl. For certain of these embodiments, $C_{1-4}$ alkyl is methyl or ethyl.

For certain embodiments, including any one of the above embodiments of Formula IV, $R^8$ is $C_{1-4}$ alkyl. For certain of these embodiments, $C_{1-4}$ alkyl is methyl or ethyl.

For certain embodiments, including any one of the above embodiments of Formula IV except where $R^7$ is $C_{1-4}$ alkyl, $R^7$ is aryl.

For certain embodiments, including any one of the above embodiments of Formula IV except where $R^8$ is $C_{1-4}$ alkyl, $R^8$ is aryl.

For certain embodiments where $R^7$ and/or $R^8$ is aryl, aryl is phenyl which is unsubstituted or substituted by one or up to five substituents independently selected from the group consisting of $C_{1-4}$ alkyl, $C_{1-4}$ alkoxy, halogen (e.g. fluoro, chloro, bromo, and/or iodo groups), hydroxy, amino, and nitro. When substituents are present, halogen and $C_{1-4}$ alkyl substituents are preferred.

For certain embodiments, including any one of the above embodiments of Formula IV, n' is an integer from 1 to 10, and in one embodiment n' is 3.

For certain embodiments, including any one of the above embodiments of Formula IV, Y is defined as in any one of the above definitions of Y. For certain of these embodiments, Y is —O$C_{1-4}$ alkyl, —OC(O)CH$_3$, or Cl.

For certain embodiments, swallow-tail silanes of the Formula IV include, but are not limited to [C$_4$F$_9$S(O)$_2$N(CH$_3$)CH$_2$]$_2$CHOCH$_2$CH$_2$CH$_2$Si(OCH$_3$)$_3$, [C$_4$F$_9$S(O)$_2$N(CH$_3$)CH$_2$]$_2$CHOC(O)NHCH$_2$CH$_2$CH$_2$Si(OCH$_3$)$_3$, and C$_4$F$_9$S(O)$_2$N(CH$_3$)CH$_2$CH$_2$CH$_2$N(S(O)$_2$C$_4$F$_9$)CH$_2$CH$_2$CH$_2$Si(OCH$_3$)$_3$.

The swallow-tail silane of the Formula IV may be prepared by known methods. For example, [C$_4$F$_9$S(O)$_2$N(CH$_3$)CH$_2$]$_2$CHOH may be made by reacting two moles of C$_4$F$_9$S(O)$_2$NHCH$_3$ with either 1,3-dichloro-2-propanol or epichlorohydrin in the presence of a base. [C$_4$F$_9$S(O)$_2$N(CH$_3$)CH$_2$]$_2$CHOCH$_2$CH$_2$CH$_2$Si(OCH$_3$)$_3$ can be made from [C$_4$F$_9$S(O)$_2$N(CH$_3$)CH$_2$]$_2$CHOH by alkylation with ClCH$_2$CH$_2$CH$_2$Si(OCH$_3$)$_3$ or by alkylation with allyl chloride, followed by hydrosilation with HSiCl$_3$ and methanolysis. Reaction of [C$_4$F$_9$S(O)$_2$N(CH$_3$)CH$_2$]$_2$CHOH with OCNCH$_2$CH$_2$CH$_2$Si(OCH$_3$)$_3$ yields [C$_4$F$_9$S(O)$_2$N(CH$_3$)CH$_2$]$_2$CHOC(O)NHCH$_2$CH$_2$CH$_2$Si(OCH$_3$)$_3$.

For certain embodiments, including any one of the above embodiments, the at least partially fluorinated composition comprising at least one silane group further includes an organic solvent.

For certain embodiments, including any one of the above embodiments wherein the at least partially fluorinated composition comprising at least one silane group is a polyfluoropolyether silane, the polyfluoropolyether silane is applied as a composition comprising the polyfluoropolyether silane and an organic solvent.

The organic solvent or blend of organic solvents used must be capable of dissolving at least about 0.01 percent by weight of one or more silanes of the Formulas I through IV. For certain embodiments, it is desirable that the solvent or mixture of solvents have a solubility for water of at least about 0.1 percent by weight, and for certain of these embodiments, a solubility for acid of at least about 0.01 percent by weight.

Suitable organic solvents, or mixtures of solvents can be selected from aliphatic alcohols, such as methanol, ethanol, and isopropanol; ketones such as acetone and methyl ethyl ketone; esters such as ethyl acetate and methyl formate; ethers such as diethyl ether, diisopropyl ether, methyl t-butyl ether and dipropyleneglycol monomethylether (DPM); hydrocarbons solvents such as alkanes, for example, heptane, decane, and paraffinic solvents; fluorinated hydrocarbons such as perfluorohexane and perfluorooctane; partially fluorinated hydrocarbons, such as pentafluorobutane; hydrofluoroethers such as methyl perfluorobutyl ether and ethyl perfluorobutyl ether.

For certain embodiments, including any one of the above embodiments, the organic solvent is a fluorinated solvent, which includes fluorinated hydrocarbons, partially fluorinated hydrocarbons, and hydrofluoroethers. For certain of these embodiments, the fluorinated solvent is a hydrofluoroether. For certain of these embodiments, the hydrofluoroether is methyl perfluorobutyl ether.

For certain embodiments, including any one of the above embodiments except where the organic solvent is a fluorinated solvent, the organic solvent is a lower alcohol. For certain of these embodiments, the lower alcohol is selected from the group consisting of methanol, ethanol, isopropanol, and mixtures thereof. For certain of these embodiments, the lower alcohol is ethanol.

For certain embodiments, including any one of the above embodiments where the organic solvent is a lower alcohol, the at least partially fluorinated composition comprising at least one silane group further comprises an acid. For certain of these embodiments, the acid is selected from the group consisting of acetic acid, citric acid, formic acid, triflic acid, perfluorobutyric acid, sulfuric acid, and hydrochloric acid. For certain of these embodiments, the acid is hydrochloric acid.

The at least partially fluorinated composition comprising at least one silane group, including any one of the above embodiments, can be applied to at least a portion of the surface of the layer comprising the silicon, oxygen, and hydrogen using a variety of coating methods. Such methods include but are not limited to spraying, dipping, rolling, brushing, spreading, flow coating, and vapor deposition.

For certain embodiments, including any one of the above embodiments, the at least partially fluorinated composition comprising at least one silane group, in any one of its above described embodiments, is applied by dipping at least a portion of the substrate upon which the layer comprising the silicon, oxygen, and hydrogen has been formed in the at least partially fluorinated composition comprising at least one silane group.

Alternatively, for certain embodiments, including any one of the above embodiments, the at least partially fluorinated composition comprising at least one silane group, in any one of its above described embodiments, is applied by spraying at least a portion of the substrate upon which the layer comprising the silicon, oxygen, and hydrogen has been formed with the at least partially fluorinated composition comprising at least one silane group.

For certain embodiments, including any one of the above embodiments except where the at least partially fluorinated composition comprising at least one silane group, is applied by other means, the at least partially fluorinated composition comprising at least one silane group, in any one of its above described embodiments, is applied by chemical vapor deposition to at least a portion of the substrate upon which the layer comprising the silicon, oxygen, and hydrogen has been formed. For certain of these embodiments, the at least partially fluorinated composition comprising at least one silane group is a polyfluoropolyether silane.

The conditions under which the at least partially fluorinated composition comprising at least one silane group, for example, the polyfluoropolyether silane is vaporized during chemical vapor deposition may vary according to the structure and molecular weight of the polyfluoropolyether silane. For certain embodiments, the vaporizing may take place at pressures less than about 1.3 Pa (about 0.01 torr), at pressures less than about 0.013 Pa (about $10^{-4}$ torr) or even about 0.0013 Pa to about 0.00013 Pa (about $10^{-5}$ torr to about $10^{-6}$ torr). For certain of these embodiments, the vaporizing may take place at temperatures of at least about 80° C., at least about 100° C., at least about 200° C., or at least about 300° C. Vaporizing may include imparting energy by, for example conductive heating, convective heating, microwave radiation heating, and the like.

The chemical vapor deposition method may reduce opportunities for contamination of the surface of the substrate through additional handling and exposure to the environment, leading to correspondingly lower yield losses. Furthermore, as the layer comprising silicon, oxygen, and hydrogen is formed by plasma deposition, it can be more efficient to apply the at least partially fluorinated composition comprising at least one silane group, for example, the polyfluoropolyether silanes in the same chamber or a connected vacuum chamber. Additionally, the polyfluoropolyether silane coatings applied by chemical vapor deposition may not need acid conditions and/or additional heating for curing. Useful vacuum chambers and equipment are known in the art. Examples include the Plasmatherm Model 3032 (available from Plasmatherm, Kresson, N.J.) and the 900 DLS (available from Satis Vacuum of America, Grove Port, Ohio).

In one embodiment, applying the polyfluoropolyether silane by chemical vapor deposition comprises placing the polyfluoropolyether silane and the substrate, having the layer comprising silicon, oxygen, and hydrogen on at least a portion of the surface of the substrate, into a chamber, decreasing the pressure in the chamber, and heating the polyfluoropolyether silane. The polyfluoropolyether silane is typically maintained in a crucible, but in some embodiments, the silane is imbibed in a porous matrix, such as a ceramic pellet, and the pellet heated in the vacuum chamber.

The at least partially fluorinated composition comprising at least one silane group, including any one of the above embodiments of Formulas I, II, III, and/or IV, undergoes reaction with the layer comprising the silicon, oxygen, and hydrogen on the substrate surface, for example, with —SiOH groups, to form a durable coating, through the formation of covalent bonds, including bonds in Si—O—Si groups. For the preparation of a durable coating, sufficient water should be present to cause hydrolysis of the hydrolyzable groups described above so that condensation to form Si—O—Si groups takes place, and thereby curing takes place. The water can be present either in the coating composition or adsorbed to the substrate surface, for example. Typically, sufficient water is present for the preparation of a durable coating if the coating method is carried out at room temperature in an atmosphere containing water, for example, an atmosphere having a relative humidity of about 30% to about 50%.

A substrate to be coated can typically be contacted with the coating composition at room temperature (typically, about 15° C. to about 30° C., or about 20° C. to about 25° C.). Alternatively, the coating composition can be applied to substrates which are preheated at a temperature of, for example, between 60° C. and 150° C. Following application of the at least partially fluorinated composition comprising at least one silane group, the treated substrate can be dried and the resulting coating cured at ambient temperature, e.g., about 15° C. to about 30° C., or elevated temperature (e.g., at about 40° C. to about 300° C.) and for a time sufficient for the curing to take place.

For certain embodiments, including any one of the above embodiments, the method of forming an easy-to-clean metal or metallized substrate further comprises the step of subjecting the substrate to an elevated temperature after applying the at least partially fluorinated composition comprising at least one silane group.

For certain embodiments, including any one of the above embodiments where the at least partially fluorinated composition comprising at least one silane group is a polyfluoropolyether silane, the method of forming an easy-to-clean metal or metallized substrate further comprises the step of subjecting the substrate to an elevated temperature after applying the polyfluoropolyether silane.

For certain embodiments, including any one of the above embodiments where the at least partially fluorinated composition comprising at least one silane group further comprises an acid, except where an elevated temperature is used, the method of forming an easy-to-clean metal or metallized substrate further comprises the step of allowing the substrate to dry at a temperature of about 15° C. to about 30° C. after applying the composition.

In another aspect, there is provided an easy-to-clean coated article comprising:
at least one of a metal substrate or a metallized substrate;
a plasma deposited layer disposed on the substrate, wherein the plasma deposited layer comprises at least about 10 atomic percent silicon, at least about 10 atomic percent oxygen, and at least about 5 atomic percent hydrogen; wherein all atomic percent values are based on the total atomic weight of the plasma deposited layer; and
a coating bonded to the plasma deposited layer;
wherein the coating comprises an at least partially fluorinated composition comprising at least one silane group which shares at least one covalent bond with the plasma deposited layer.

In one preferred embodiment, there is provided an easy-to-clean coated article comprising:
at least one of a metal substrate or a metallized substrate;
a plasma deposited layer disposed on the substrate, wherein the plasma deposited layer comprises at least about 10 atomic percent silicon, at least about 10 atomic percent oxygen, and at least about 5 atomic percent hydrogen; wherein all atomic percent values are based on the total atomic weight of the plasma deposited layer; and
a polyfluoropolyether-containing coating bonded to the plasma deposited layer; wherein the polyfluoropolyether-containing coating comprises polyfluoropolyether silane groups of the following Formula Ib:

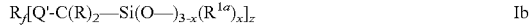

$$R_f[Q'\text{-}C(R)_2\text{---}Si(O\text{---})_{3-x}(R^{1a})_x]_z \quad \text{Ib}$$

which shares at least one covalent bond with the plasma deposited layer; and
wherein:
$R_f$ is a monovalent or multivalent polyfluoropolyether segment;
Q' is an organic divalent linking group;
each R is independently hydrogen or a $C_{1-4}$ alkyl group;
$R^{1a}$ is a $C_{1-8}$ g alkyl or phenyl group;
x is 0 or 1 or 2; and
z is 1, 2, 3, or 4.

The at least on covalent bond shared with the plasma deposited layer is a bond to an oxygen atom in $Si(O\text{---})_{3-x}$.

For certain embodiments of the easy-to-clean coated article, the plasma deposited layer comprises at least about 20 atomic percent silicon, based on the total atomic weight of the plasma deposited layer. The atomic percent of silicon, as well as other elements such as oxygen and carbon, can be determined by a well established quantitative surface analytical technique such as Electron Spectroscopy for Chemical Analysis (ESCA) or Auger Electron Spectroscopy (AES). The atomic percentage as determined by ESCA and AES techniques is based on a hydrogen-free basis. Hydrogen content in the film may be determined by techniques such as Infra-Red Spectroscopy (IR) or quantitatively by combustion analysis or Rutherford Backscattering Spectroscopy (RBS).

For certain embodiments, including any one of the above embodiments of the easy-to-clean coated article, the plasma deposited layer further comprises at least about 15 atomic percent oxygen, based on the total atomic weight of the plasma deposited layer.

For certain embodiments, including any one of the above embodiments of the easy-to-clean coated article, the plasma deposited layer further comprises carbon and/or nitrogen such that the total atomic content of the carbon and/or nitrogen is at least 5 atomic percent, based on the total atomic weight of the plasma deposited layer. For certain of these embodiments, the plasma deposited layer further comprises carbon such that the total atomic content of the carbon is at least 5 atomic percent, based on the total atomic weight of the plasma deposited layer.

For certain embodiments, including any one of the above embodiments of the easy-to-clean coated article, the thickness of the plasma deposited layer is at least about 0.5 nanometer and not more than about 100 nanometers. For certain of these embodiments, the thickness of the plasma deposited layer is at least about 1 nanometer and not more than about 10 nanometers.

For certain embodiments, the plasma deposited layer imparts at least one of a color hue or an increased intensity of a color hue.

For certain embodiments, including any one of the above embodiments of the easy-to-clean coated article, the monovalent or multivalent polyfluoropolyether segment, $R_f$, is defined according to any one of the embodiments of $R_f$ described in the above method.

For certain embodiments, including any one of the above embodiments of the easy-to-clean coated article, the polyfluoropolyether segment, $R_f$, includes perfluorinated repeating units selected from the group consisting of —$(C_nF_{2n}O)$—, —$(CF(Z)O)$—, —$(CF(Z)C_nF_{2n}O)$—, —$(C_nF_{2n}CF(Z)O)$—, —$(CF_2CF(Z)O)$—, and combinations thereof; and wherein Z is a perfluoroalkyl group, an oxygen-containing perfluoroalkyl group, a perfluoroalkoxy group, or an oxygen-substituted perfluoroalkoxy group, each of which can be linear, branched, or cyclic, and have 1 to 9 carbon atoms and up to 4 oxygen atoms when oxygen-containing or oxygen-substituted; and n is an integer from 1 to 12.

For certain embodiments, including any one of the above embodiments of the easy-to-clean coated article, $R_f$ is selected from the group consisting of —$CF_2O(CF_2O)_m$ $(C_2F_4O)_pCF_2$—, —$CF(CF_3)$—$(OCF_2CF(CF_3))_pO$—$R_f'$—O $(CF(CF_3)CF_2O)_pCF(CF_3)$—, —$CF_2O(C_2F_4O)_pCF_2$—, and —$(CF_2)_3O(C_4F_8O)_p(CF_2)_3$—, and wherein $R_f'$ is a divalent, perfluoroalkylene group containing at least one carbon atom and optionally interrupted in chain by O or N, m is 1 to 50, and p is 3 to 40. For certain of these embodiments, $R_f$ is —$CF_2O$ $(CF_2O)_m(C_2F_4O)_pCF_2$—, and Q-$C(R)_2$—$Si(Y)_{3-x}(R^1)_x$ is $C(O)NH(CH_2)_3Si(OR^1)_3$, wherein $R^1$ is methyl or ethyl.

As indicated above, substrates used in the method and easy-to-clean article of the invention are comprised of a metal and/or metal alloy, which is solid at room temperature. For certain embodiments, the substrate is preferably comprised of a hard surface. A hard surface is capable of retaining its shape and structure without deforming appreciably when wiped.

For certain embodiments, including any one of the above embodiments, the substrate comprises at least one of chromium or a chromium alloy. For certain of these embodiments, a major surface of the substrate further comprises a chromium oxide.

For certain embodiments, including any one of the above embodiments of the easy-to-clean coated article, the thickness of the polyfluoropolyether-containing coating is at least about 20 nanometers, preferably at least about 30 nanometers, and most preferably at least about 50 nanometers. For certain of these embodiments, the thickness is not more than about 200 nanometer, preferably not more than about 150 nanometers, and most preferably not more than about 100 nanometers.

Objects and advantages of this invention are further illustrated by the following examples, but the particular materials and amounts thereof recited in these examples, as well as other conditions and details, should not be construed to unduly limit this invention.

EXAMPLES

Preparation of $(CH_3O)_3Si(CH_2)_3NHCOCF_2$
$(OCF_2CF_2)_{9-10}(OCF_2)_{9-10}OCF_2CONH(CH_2)_3Si$
$(OCH_3)_3$ $CH_3OC(O)CF_2(OCF_2CF_2)_{9-10}(OCF_2)_{9-10}OCF_2C(O)$
$OCH_3$ (a perfluoropolyether diester obtained from Solvay Solexis, Houston, Tex., available under the trade designation "FOMBLIN ZDEAL") (50 grams (g)) was added to an oven-dried 100-mL round bottom flask under a nitrogen atmosphere and stirred rapidly at room temperature using a magnetic stirrer. 3-Aminopropyltrimethoxysilane (9.1 g) (obtained from GE Silicones, Wilton, Conn., available under the trade designation "SILQUEST A-1110") was added to the flask in one portion. Initially the mixture was two-phase, and as the reagents mixed the mixture became cloudy. A reaction exotherm to a temperature of 30° C. was observed, and then the reaction gradually cooled to room temperature and became a slightly hazy light yellow liquid. The reaction was monitored by gas chromatography (GC) to observe excess 3-aminopropyltrimethoxysilane and fourier transform infrared spectroscopy (FTIR) to observe unreacted ester functional groups and was found to be complete within 30 minutes after the addition of 3-aminopropyltrimethoxysilane.

The reaction product was stirred rapidly, and the pressure in the flask was reduced to 1 mmHg (133 Pa) gradually to minimize bumping. Methanol was distilled from the flask over a period of two hours, and 57.5 g of $(CH_3O)_3Si(CH_2)_3$ $NHCOCF_2(OCF_2CF_2)_{9-10}(OCF_2)_{9-10}OCF_2CONH(CH_2)_3Si$ $(OCH_3)_3$ was recovered from the flask.

Plasmatherm Batch Reactor

Examples 1-8 were treated in batch plasma system Plasmatherm Model 3032, available from Plasmatherm, Kresson, N.J., which was configured for reactive ion etching with a 26-inch lower powered electrode and central gas pumping. The chamber was connected to a roots style blower (Edwards Model EH1200, Boc Edwards, West Sussex, United Kingdom) backed by a dry mechanical pump (Edwards Model iQDP80, Boc Edwards). Plasma was powered by a 5 kW, 13.56 MHz solid-state generator (RF Plasma Products Model RF50S0, available from MKS Power Generators and Subsystems, Wilmington, Mass.) and a radio frequency impedance matching network (Plasmatherm Model AMN-30, available from Plasmatherm). The system had a nominal base pressure of 5 mTorr (0.67 Pa). The flow rates of gases were controlled by flow controllers available from MKS Power Generators and Subsystems. Substrates for deposition were placed on the lower powered electrode.

The substrates used in Examples 1-5 and 8, Comparative Example 1, and control experiments (i.e., tests on substrates with no treatment) were obtained from Ideal Standard, Wittlich, Germany. The substrates for Examples 1-3, 5, and 8, Comparative Example 1, and the control experiments were metal fittings with a layer of electroplated chromium on the surface. The substrate for Example 4 was a plastic plate with a layer of electroplated chromium on the surface. The substrate for Example 7 was an aluminum panel, available from ACT Laboratories, Inc., Hillsdale, Mich.

Examples 1 and 2

Plasma Treatment Method

Step 1. A small faucet fitting (Example 1) and a large faucet fitting (Example 2) were first treated in an oxygen plasma by flowing oxygen gas (99.99%, UHP Grade, available from Scott Specialty Gases, Plumsteadville, Pa.), at 500 standard cubic centimeters per minute (sccm) flow rate and maintaining the pressure at 52 millitorr (mtorr) (6.9 Pascals (Pa)) and plasma power of 1000 watts. The oxygen priming step was carried out for 20 seconds.

Step 2. Following the oxygen plasma priming, tetramethylsilane (99.9%, NMR Grade, available from Sigma-Aldrich Chemicals, St. Louis, Mo.) was introduced. Tetramethylsilane vapor was introduced into the chamber at a flow rate of 150 sccm while the oxygen flow was maintained at 500 sccm. The pressure was held at 64 mtorr (8.5 Pa), and plasma power was held at 1000 watts. The treatment time was 10 seconds.

Step 3. The tetramethylsilane gas was then shut off and the oxygen gas continued to run at a flow of 500 sccm. The pressure was maintained at 150 mtorr (20 Pa), and plasma power delivered at 300 watts. This final step of post-deposition oxygen plasma treatment lasted 60 seconds. After the three plasma treatment steps were completed, the chamber was vented to atmosphere and the fittings were wrapped in aluminum foil.

Silane Treatment

A solution (3 liters (L)) of 0.1% $(CH_3O)_3Si(CH_2)_3NH-$ $COCF_2(OCF_2CF_2)_{9-10}(OCF_2)_{9-10}OCF_2CONH(CH_2)_3Si$ $(OCH_3)_3$ in HFE-7100 fluid (available from 3M Company, St. Paul, Minn. under the trade designation "NOVEC HFE-7100") was placed in a 4-L beaker at room temperature. The beaker was placed in a dip coater. Each fitting, which had been plasma-treated according to the method described above, was fixed vertically above the solution and introduced into the solution at a controlled rate. Once the fitting was submerged entirely into the solution, it was held in place for five seconds. The fitting was withdrawn from the solution at 15 millimeters (mm) per second and then placed in an aluminum pan. The pan was then placed in an oven at 100° C. for 30 minutes. The fitting was then allowed to stand at least 24 hours before contact angle measurement.

Contact angles versus water and hexadecane were measured on the fittings of Examples 1 and 2 using a KRUSS G120/G140 MKI goniometer (Kruss USA, Charlotte, N.C.). Larger values of contact angles indicate better repellency. The mean values of 3 measurements and are reported in degrees in Table 1 (below).

TABLE 1

| Treatment | Contact angles (°) versus water | | | Contact angles (°) versus hexadecane | | |
| --- | --- | --- | --- | --- | --- | --- |
| | advancing | static | receding | advancing | static | receding |
| Example 1 | 120.6 | 110.9 | 88.2 | 72.55 | 69.9 | 56.25 |
| Example 2 | 122.33 | 112.83 | 96.26 | 71.7 | 69.35 | 60.4 |

Example 3

A nearly flat, round metal disc having a layer of electroplated chromium was treated according to the plasma treatment method of Examples 1 and 2 except that in Step 1, the pressure was maintained at 45 mtorr (6.0 Pa), and in Step 2, the pressure was held at 50 mTorr (6.7 Pa). Prior to the plasma treatment, the chamber was pumped down to a base pressure of 10 mtorr (1.3 Pa). The disc was then dip coated according to the silane treatment method of Examples 1 and 2 except the samples were heated in a forced-air oven at 120° C. for 20 minutes after the coating step.

The method of Example 3 was repeated, using treatment times in Step 2 of 2 seconds, 5 seconds, and 20 seconds. After a 20-second treatment, the color of the surface of the fitting turned to a slightly brown color. Each treatment time resulted in a fitting with improved cleanability.

Comparative Example 1

A nearly flat, round metal disc having a layer of electroplated chromium was dip coated according to the silane treatment method of Examples 1 and 2 except the sample was heated in a forced-air oven at 120° C. for 20 minutes after the coating step. No plasma treatment step was carried out.

Static contact angles were measured versus water and hexadecane on the discs of Example 3 and Comparative Example (CE) 1 and an untreated disc using an Olympus model TGHM goniometer (available from Olympus Corporation of America, Pompano Beach, Fla.). An abrasion test was carried out by applying all-purpose cleaner (available from S C Johnson, Racine, Wis., under the trade designation "MR MUSCLE") and wiping with a wipe (available from 3M Company, St. Paul, Minn. under the trade designation "3M HIGH PERFORMANCE WIPE") 5000 times. Static contact angles were measured again after the abrasion test. For contact angles measurements, the mean values of 3 measurements and are reported in degrees in Table 2 (below).

TABLE 2

| Treatment | Contact Angle (°) Before abrasion test | | Contact Angle (°) After abrasion test | |
| --- | --- | --- | --- | --- |
| | water | hexadecane | water | hexadecane |
| Example 3 | 108 | 68 | 95 | 58 |
| CE 1 | 96 | 62 | 55 | 35 |
| None | 42 | <20 | 40 | <20 |

The cleanability of the fittings of Example 3 and CE 1 and an untreated disc was carried out by applying mineral water (available from Tonissteiner, Germany). The water was sprayed at 0.5 bar ($5 \times 10^4$ Pa) at room temperature until the substrate was completely covered. The substrate was placed in an oven for two hours at 70° C., removed, and allowed to cool. Limestone deposits were present on the substrates, which were then cleaned with a dry paper wipe. The cleaning results were evaluated visually and rated on a scale of 0 (impossible to remove the deposits) to 10 (no visual marks left after 3 wipes). The substrates were subjected to the test procedure up to five times. The results are shown in Table 3 (below).

TABLE 3

| Treatment | Cleanability Rating (0-10) |
| --- | --- |
| Example 3 | 9 after 5 test cycles |
| CE 1 | 1 after 2 test cycles |
| None | 0 after 1 test cycle |

Examples 4-8

The plasma treatment method of Examples 1 and 2 was applied to the substrates shown in Table 4 (below).

TABLE 4

| Example | Substrate | Static Contact Angle (°) | | Advancing Contact Angle (°) | | Receding Contact Angle (°) | |
| --- | --- | --- | --- | --- | --- | --- | --- |
| | | water | hexadecane | water | hexadecane | water | hexadecane |
| 4 | Chromed Plastic Plate | 106.9 | 68.3 | 116.7 | 70.0 | 84.1 | 67.2 |
| 5 | Chromed Metal Plate | 105.9 | 67.7 | 115.0 | 71.7 | 72.4 | 66.0 |
| 6 | Stainless Steel Plate | 103.3 | 67.6 | 111.5 | 69.2 | 75.5 | 65.1 |
| 7 | Aluminum Plate | 105.5 | 67.8 | 112.5 | 70.9 | 65.5 | 56.3 |
| 8 | Chromed Metal Handle | 106.5 | 68.5 | 120.8 | 77.0 | 40.3 | 44.5 |
| control | Untreated Chromed Metal Plate | 53.2 | low$^a$ | 49.9 | low$^a$ | 14.2 | low$^a$ |

$^a$too low to measure

After the plasma treatment, the substrates were wrapped in a knitted polyester wipe (available from VWR International, West Chester, Pa.).

Chemical Vapor Deposition (CVD) of Silanes

The substrates were placed in a vapor deposition chamber, and $(CH_3O)_3Si(CH_2)_3NHCOCF_2(OCF_2CF_2)_{9-10}(OCF_2)_{9-10}OCF_2CONH(CH_2)_3Si(OCH_3)_3$ was placed on a black graphite strip inside the chamber using a syringe. Vacuum was applied, and when the pressure in the chamber reached $4 \times 10^{-6}$ torr ($5.3 \times 10^{-4}$ Pa), heat was applied to the black graphite strip using a variac. $(CH_3O)_3Si(CH_2)_3NHCOCF_2(OCF_2CF_2)_{9-10}(OCF_2)_{9-10}OCF_2CONH(CH_2)_3Si(OCH_3)_3$ was vaporized at 450° C.-500° C. to form a thin coating on the metal surface.

The coated substrates were allowed to stand at ambient conditions for 24 hours before contact angle measurements were taken. Contact Angles were measured for Examples 4-8 and an untreated chromed metal plate using the method described above for Examples 1 and 2. The results are shown in Table 4 (above).

The complete disclosures of the patents, patent documents and publications cited herein are incorporated by reference in their entirety as if each were individually incorporated. In case of conflict, the present specification, including definitions, shall control. Various modifications and alterations to this invention will become apparent to those skilled in the art without departing from the scope and spirit of this invention. Illustrative embodiments and examples are provided as examples only and are not intended to limit the scope of the present invention. The scope of the invention is limited only by the claims set forth as follows.

What is claimed is:

1. A method of forming at least one of an easy-to-clean metal substrate or an easy-to-clean metallized substrate, the method comprising:
forming a layer comprising silicon, oxygen, and hydrogen on at least a portion of a surface of the substrate by plasma deposition; and
applying an at least partially fluorinated composition comprising at least one silane group to at least a portion of a surface of the layer comprising the silicon, oxygen, and hydrogen.

2. The method of claim 1, wherein forming the layer comprising the silicon, oxygen, and hydrogen comprises ionizing a gas comprising at least one of an organosilicon or a silane compound.

3. The method of claim 2, wherein the organosilicon comprises tetramethylsilane.

4. The method of claim 2, wherein the silane compound comprises $SiH_4$.

5. The method of claim 2, wherein the gas further comprises oxygen.

6. The method of claim 1, wherein the substrate is exposed to an oxygen plasma prior to the plasma deposition of the layer comprising the silicon, oxygen, and hydrogen.

7. The method of claim 1, wherein the layer comprising the silicon, oxygen, and hydrogen is exposed to an oxygen plasma.

8. The method of claim 1, wherein the at least partially fluorinated composition comprising at least one silane group is a polyfluoropolyether silane.

9. The method of claim 8, wherein the polyfluoropolyether silane is of the Formula Ia:

$$R_f[Q'-C(R)_2-Si(Y')_{3-x}(R^{1a})_x]_z \qquad \text{Ia}$$

wherein:
$R_f$ is a monovalent or multivalent polyfluoropolyether segment;
Q' is an organic divalent linking group;
each R is independently hydrogen or a $C_{1-4}$ alkyl group;
each Y' is a hydrolysable group independently selected from the group consisting of halogen, alkoxy, acyloxy, polyalkyleneoxy, and aryloxy groups;
$R^{1a}$ is a $C_{1-8}$ alkyl or phenyl group;
x is 0 or 1 or 2; and
z is 1, 2, 3, or 4.

10. The method of claim 9, wherein the polyfluoropolyether segment, $R_f$, comprises perfluorinated repeating units selected from the group consisting of $-(C_nF_{2n}O)-$, $-(CF(Z)O)-$, $-(CF(Z)C_nF_{2n}O)-$, $-(C_nF_{2n}CF(Z)O)-$, $-(CF_2CF(Z)O)-$, and combinations thereof; and wherein Z is a perfluoroalkyl group, an oxygen-containing perfluoroalkyl group, a perfluoroalkoxy group, or an oxygen-substituted perfluoroalkoxy group, each of which can be linear, branched, or cyclic, and have 1 to 9 carbon atoms and up to 4 oxygen atoms when oxygen-containing or oxygen-substituted; and n is an integer from 1 to 12.

11. The method of claim 1, wherein the at least partially fluorinated composition comprising at least one silane group further comprises an organic solvent.

12. The method of claim 1, wherein the at least partially fluorinated composition comprising at least one silane group is applied by chemical vapor deposition.

13. The method of claim 1, further comprising subjecting the substrate to an elevated temperature after applying the at least partially fluorinated composition comprising at least one silane group.

14. An easy-to-clean coated article comprising:
at least one of a metal substrate or a metallized substrate;
a plasma deposited layer disposed on the substrate, wherein the plasma deposited layer comprises at least 10 atomic percent silicon, at least 10 atomic percent oxygen, and at least 5 atomic percent hydrogen; wherein all atomic percent values are based on the total atomic weight of the plasma deposited layer; and
a polyfluoropolyether-containing coating bonded to the plasma deposited layer;
wherein the polyfluoropolyether-containing coating comprises polyfluoropolyether silane groups of the following Formula Ib:

$$R_f[Q'-C(R)_2-Si(O-)_{3-x}(R^{1a})_x]_z \qquad \text{Ib}$$

which shares at least one covalent bond with the plasma deposited layer; and
wherein:
$R_f$ is a monovalent or multivalent polyfluoropolyether segment;
Q' is an organic divalent linking group;
each R is independently hydrogen or a $C_{1-4}$ alkyl group;
$R^{1a}$ is a $C_{1-8}$ alkyl or phenyl group;
x is 0 or 1 or 2; and
z is 1, 2, 3, or 4.

15. The easy-to-clean coated article of claim 14, wherein the plasma deposited layer further comprises carbon such that the total atomic content of the carbon is at least 5 atomic percent, based on the total atomic weight of the plasma deposited layer.

16. The easy-to-clean coated article of claim 14, wherein the thickness of the plasma deposited layer is at least about 0.5 nanometer and not more than about 100 nanometers.

17. The easy-to-clean coated article of claim 14, wherein the polyfluoropolyether segment, $R_f$, includes perfluorinated repeating units selected from the group consisting of $-(C_nF_{2n}O)-$, $-(CF(Z)O)-$, $-(CF(Z)C_nF_{2n}O)-$, $-(C_nF_{2n}CF(Z)O)-$, $-(CF_2CF(Z)O)-$, and combinations thereof; and wherein Z is a perfluoroalkyl group, an oxygen-containing perfluoroalkyl group, a perfluoroalkoxy group, or an oxygen-substituted perfluoroalkoxy group, each of which can be linear, branched, or cyclic, and have 1 to 9 carbon atoms and up to 4 oxygen atoms when oxygen-containing or oxygen-substituted; and n is an integer from 1 to 12.

18. The method of claim 1, wherein the substrate comprises chromium or a chromium alloy.

19. The method of claim 8 wherein the polyfluoropolyether silane is applied by chemical vapor deposition.

20. The easy-to-clean article of claim 14, wherein the substrate comprises chromium or a chromium alloy.

* * * * *